(12) United States Patent
Jung et al.

(10) Patent No.: US 9,324,743 B2
(45) Date of Patent: Apr. 26, 2016

(54) FLAT PANEL DISPLAY DEVICE WITH OXIDE THIN FILM TRANSISTOR AND METHOD OF FABRICATING THE SAME

(71) Applicant: LG Display Co., Ltd., Seoul (KR)

(72) Inventors: Ki Young Jung, Paju-si (KR); Ki Tae Kim, Paju-si (KR); Chang Hoon Han, Hanam-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/101,160

(22) Filed: Dec. 9, 2013

(65) Prior Publication Data

US 2014/0353660 A1 Dec. 4, 2014

(30) Foreign Application Priority Data

May 28, 2013 (KR) .................. 10-2013-0060259

(51) Int. Cl.
| | |
|---|---|
| *H01L 29/10* | (2006.01) |
| *H01L 27/12* | (2006.01) |
| *H01L 29/66* | (2006.01) |
| *H01L 29/786* | (2006.01) |
| *H01L 29/423* | (2006.01) |

(52) U.S. Cl.
CPC ........ *H01L 27/1288* (2013.01); *H01L 27/1225* (2013.01); *H01L 29/66742* (2013.01); *H01L 29/78621* (2013.01); *H01L 29/78693* (2013.01); *H01L 2029/42388* (2013.01)

(58) Field of Classification Search
CPC ........................... H01L 29/7869; H01L 21/16
USPC ............................................. 257/43; 438/104
See application file for complete search history.

(56) References Cited

U.S. PATENT DOCUMENTS

| | | | |
|---|---|---|---|
| 5,627,084 A | 5/1997 | Yamazaki et al. | |
| 5,668,019 A | 9/1997 | Kobayashi et al. | |
| 6,362,027 B1 | 3/2002 | Yamazaki et al. | |
| 6,677,613 B1 * | 1/2004 | Yamazaki ........... | G02F 1/13454 257/40 |
| 6,744,069 B1 | 6/2004 | Yamazaki et al. | |

(Continued)

FOREIGN PATENT DOCUMENTS

| | | |
|---|---|---|
| TW | 475271 B | 2/2002 |
| TW | 200611411 | 4/2006 |
| WO | WO 2009/136645 A2 | 11/2009 |

OTHER PUBLICATIONS

European Patent Office, Search Report and Opinion, European Patent Application No. 13196668.1, Oct. 15, 2014, nine pages.

(Continued)

*Primary Examiner* — Jami M Valentine
(74) *Attorney, Agent, or Firm* — Fenwick & West LLP (57) ABSTRACT

A flat panel display device with an oxide thin film transistor is disclosed which includes: an oxide semiconductor layer which has a width of a first length and is formed on a buffer film; a gate insulation film which has a width of a second length and is formed on the oxide semiconductor layer; a gate electrode which has a width of a third length and is formed on the gate insulation film; an interlayer insulation film formed on the entire surface of the substrate provided with the gate electrode; source and drain electrodes formed on the interlayer insulation film and connected to the oxide semiconductor layer; a pixel electrode formed on a passivation film and connected to the drain electrode. The first length is larger than the second length and the second length is larger than the third length.

5 Claims, 5 Drawing Sheets

(56) References Cited

U.S. PATENT DOCUMENTS

| | | | |
|---|---|---|---|
| 2001/0019127 A1 | 9/2001 | Ishida | |
| 2001/0038127 A1* | 11/2001 | Yamazaki | G02F 1/13452 257/359 |
| 2006/0141685 A1* | 6/2006 | Kim et al. | 438/149 |
| 2007/0013078 A1* | 1/2007 | Lee et al. | 257/762 |
| 2007/0026555 A1* | 2/2007 | Lee | 438/30 |
| 2007/0108483 A1 | 5/2007 | Lim et al. | |
| 2008/0012021 A1* | 1/2008 | Adachi | 257/72 |
| 2009/0135102 A1* | 5/2009 | Park | 345/76 |
| 2010/0065841 A1* | 3/2010 | Lee et al. | 257/43 |
| 2011/0042670 A1 | 2/2011 | Sato et al. | |
| 2011/0210327 A1 | 9/2011 | Kondo et al. | |
| 2012/0003795 A1 | 1/2012 | Noda | |
| 2013/0256652 A1* | 10/2013 | Lee | H01L 29/786 257/43 |
| 2013/0320328 A1* | 12/2013 | Lee | H01L 29/7869 257/43 |
| 2014/0042428 A1* | 2/2014 | Ning | H01L 29/66969 257/43 |
| 2014/0042429 A1* | 2/2014 | Park | H01L 29/66742 257/43 |
| 2014/0054579 A1* | 2/2014 | Kim | H01L 29/786 257/43 |
| 2014/0061632 A1* | 3/2014 | Lee | H01L 29/78633 257/43 |
| 2014/0167040 A1* | 6/2014 | Lee | H01L 29/66969 257/43 |

OTHER PUBLICATIONS

Taiwan Intellectual Property Office, First Office Action, Taiwanese Patent Application No. 102147271, May 22, 2015, nine pages.

\* cited by examiner

FLAT PANEL DISPLAY DEVICE WITH OXIDE THIN FILM TRANSISTOR AND METHOD OF FABRICATING THE SAME

CROSS REFERENCE TO RELATED APPLICATIONS

The present application claims priority under 35 U.S.C. §119(a) of Korean Patent Application No. 10-2013-0060259 filed on May 28, 2013 which is hereby incorporated by references in its entirety.

BACKGROUND

1. Field of the Disclosure

The present application relates to a flat panel display device, and more particularly to a flat panel display device with oxide thin film transistor and a fabricating method which are adapted to secure reliability and structural stability of elements.

2. Description of the Related Art

The flat panel display device such as a liquid crystal display device drives a display element using an active element, such as a thin film transistor, which is disposed in each pixel. Such a driving mode of the display device is called as an active matrix driving mode. In the active matrix driving mode, the thin film transistor is disposed in each pixel and is used to drive the respective pixel.

Currently, a thin film transistor with a channel layer formed from one of an amorphous silicon film and a polycrystalline silicon film is being most widely used.

The amorphous silicon film can be thinly deposited at a lower temperature than 350° C. However, the mobility of amorphous silicon is slow below 0.5 cm$^2$/Vs. Due to this, it is difficult for amorphous silicon to realize high definition and high driving speed in a super-sized screen. On the other hand, polycrystalline silicon has a high mobility of several tens through several hundreds cm$^2$/Vs.

In view of this point, the amorphous silicon thin film transistor is utilized for driving the pixel, and the polycrystalline thin film transistor is utilized for driving and controlling the entire screen or picture.

Figure 1:
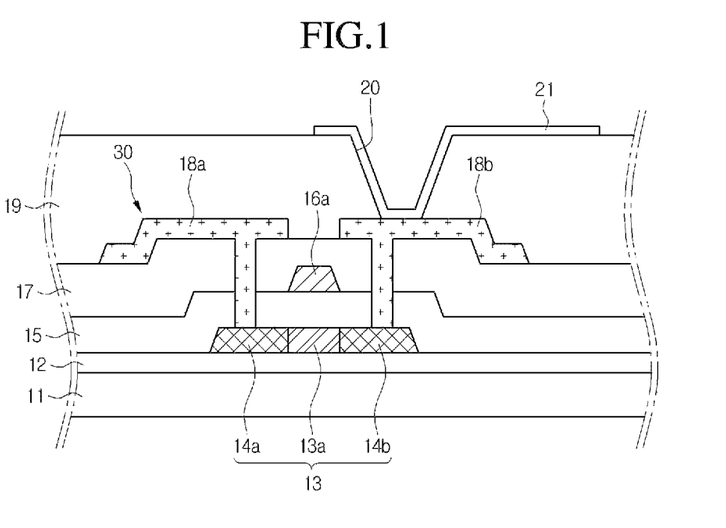
FIG. 1 is a cross-sectional view illustrating a flat panel display device with polycrystalline silicon thin film transistors and a fabricating method thereof according to the related art

FIG. 1 is a cross-sectional view illustrating a flat panel display device with polycrystalline silicon thin film transistors and a fabricating method thereof according to the related art.

Referring to FIG. 1, the flat panel display device using a polycrystalline thin film transistor includes a thin film transistor 30 formed on a substrate 11, and a pixel electrode 21 connected to the thin film transistor 30.

The thin film transistor 30 includes a buffer film 12 formed on the entire surface of the substrate 11, a semiconductor layer 13 formed on the buffer film 12, and a gate insulation film 15 formed on the entire surface of the buffer film 12 in such a manner as to cover the semiconductor layer 13. Also, the thin film transistor 30 includes a gate electrode 16a formed on the gate insulation film 15, an interlayer insulation film 17 formed on the entire surface of the gate insulation film 15 which is provided with the gate electrode 16a, and source and drain electrodes 18a and 18b formed on the interlayer insulation film 17 and connected to source and drain regions 14a and 14b of the semiconductor layer 13, respectively.

The flat panel display device further includes a passivation film 19 formed on the interlayer insulation film 17 provided with the source and drain electrodes 18a and 18b. The pixel electrode 21 is formed on the passivation film 19 and connected to the drain electrode 18b through a contact hole 20 which is formed in the passivation film 19.

Also, the method of fabricating such a flat panel display device includes sequentially forming the buffer film 12, the semiconductor layer 13, the gate insulation film 15 and the gate electrode 16a on the substrate 11, injecting a dopant into the semiconductor layer 13, and sequentially forming the interlayer insulation film 17, the source and drain electrodes 18a and 18b, the passivation film 19 and the pixel electrode 21 on the gate insulation film 15 which is provided with the gate electrode 16a.

The semiconductor layer 13 formed from polycrystalline silicon can be obtained by crystallizing the amorphous silicon layer. The polycrystalline silicon semiconductor layer 13 obtained from the crystallization of amorphous silicon can have a comparative satisfactory crystallinity, but must be treated at a high temperature of above 1000° C.

The doping procedure for the semiconductor layer 13 includes forming low density regions using the gate electrode 16a as a mask, and forming high density regions using a photoresist pattern, which exposes portions of the semiconductor layer 13 corresponding to the source and drain regions 14a and 14b, as another mask. The low density regions (not shown) are used to reduce an off-current of the thin film transistor 30. The high density regions become the source and drain regions 14a and 14b.

However, the formation of high density regions using the photoresist pattern, which exposes the portions of the semiconductor layer 13 corresponding to the source and drain regions 14a and 14b, as a mask requires an additional mask procedure with the exception of a mask procedure for forming the gate electrode 16a.

BRIEF SUMMARY

Accordingly, embodiments of the present application are directed to a flat panel display device and a fabricating method thereof that substantially obviate one or more of problems due to the limitations and disadvantages of the related art.

The embodiments are to provide a flat panel display device with an oxide thin film transistor adapted to secure an effective channel length, and a method of fabricating the same.

Also, the embodiments are to provide a fabricating method of a flat panel display device with an oxide thin film transistor which is adapted to reduce the number of mask procedures.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment for solving problems of the related art, a flat panel display device includes: a buffer film formed on a substrate; an oxide semiconductor layer which has a width of a first length and is formed on the buffer film; a gate insulation film which has a width of a second length and is formed on the oxide semiconductor layer; a gate electrode which has a width of a third length and is formed on the gate insulation film; an interlayer insulation film formed on the gate electrode over the entire surface of the substrate; source and drain electrodes formed on the interlayer insulation film and connected to the oxide semiconductor layer; a passivation film formed on the source and drain electrodes over the entire surface of the substrate; and a pixel electrode formed on the passivation film and connected to the drain electrode. The first length is larger than the second length and the second length is larger than the third length.

A fabricating method of a flat panel display device with an oxide thin film transistor according to another general aspect of the present embodiment for solving problems of the related art includes: forming a buffer film on a substrate; forming an oxide semiconductor layer with a width of a first length on the buffer film; forming a gate insulation film with a width of a second length and a gate electrode with a width of a third length on the oxide semiconductor layer; forming source and drain regions by metallizing the oxide semiconductor layer using the gate insulation film; forming an interlayer insulation film on the gate electrode over the entire surface of the substrate; forming source and drain electrodes, which are respectively connected to the source and drain regions, on the interlayer insulation film; forming a passivation film on the source and drain electrodes over the entire surface of the substrate; and forming a pixel electrode, which is connected to the drain electrode, on the passivation film, wherein the first length is larger than the second length and the second length is larger than the third length.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Reference will now be made in detail to the embodiments of the present disclosure, a flat panel display device with an oxide thin film transistor and a fabricating method thereof (examples) of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2:
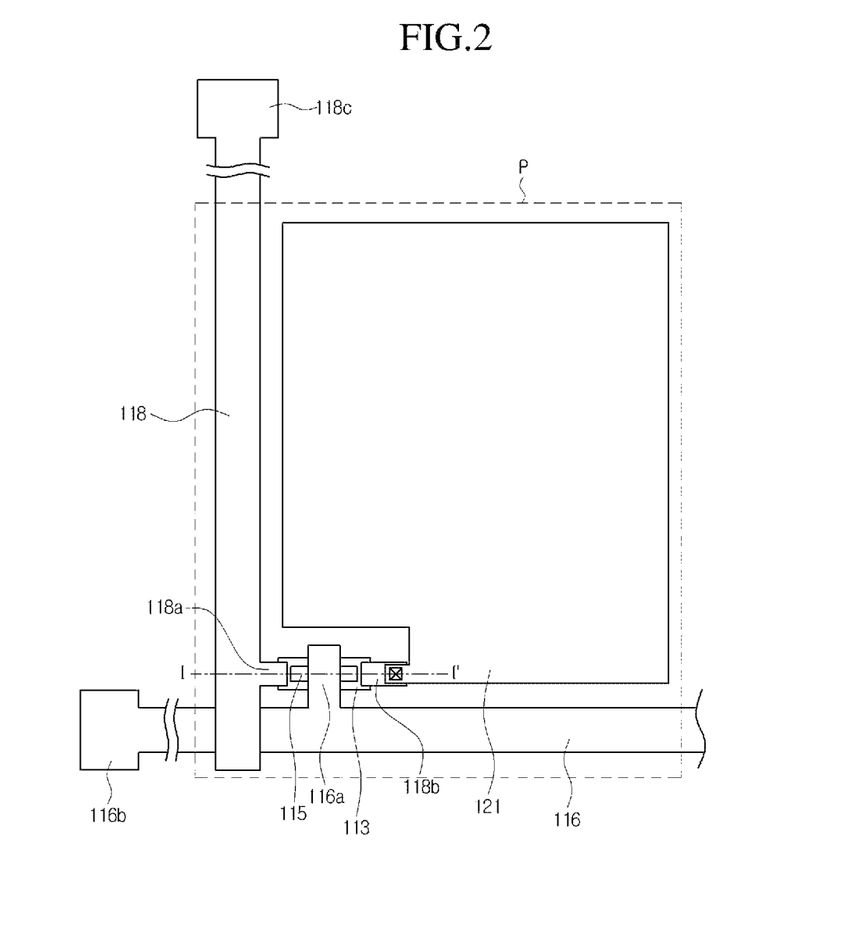
FIG. 2 is a planar view showing a flat panel display device with an oxide thin film transistor according to an embodiment of the present disclosure.
Figure 3:
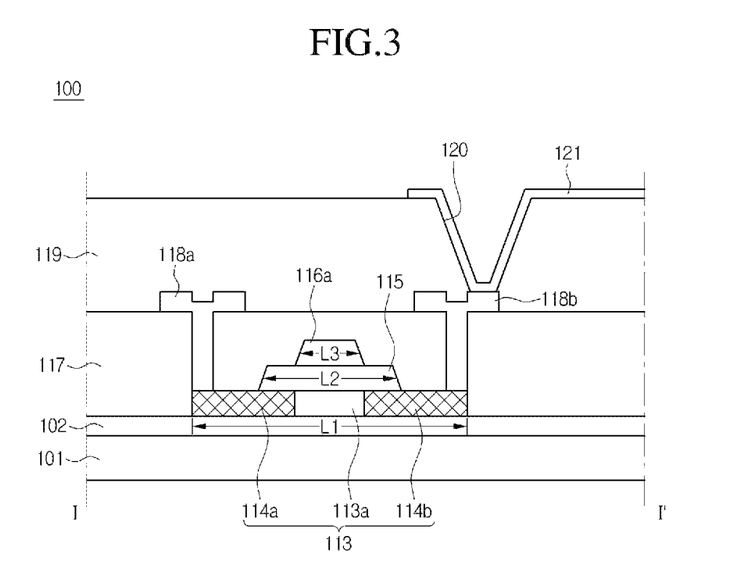
FIG. 3 is a cross-sectional view showing the flat panel display device taken along a line I-I' in FIG. 2.

FIG. 2 is a planar view showing a flat panel display device with an oxide thin film transistor according to an embodiment of the present disclosure. FIG. 3 is a cross-sectional view showing the flat panel display device taken along a line I-I' in FIG. 2.

Referring to FIGS. 2 and 3, the flat panel display device with the oxide thin film transistor according to an embodiment of the present disclosure includes a thin film transistor array substrate 100 on which a top gate thin film transistor is formed.

In detail, pixel regions P are defined by a plurality of gate lines 116 and a plurality of data lines 118 which are arranged in a matrix shape on a substrate 101. A thin film transistor is formed at an intersection of the gate line 116 and the data line 118. The thin film transistor is used to switch a signal to be transferred to the respective pixel. A pixel electrode 121 connected to the thin film transistor is formed in the pixel region.

The thin film transistor includes: a buffer film 102 formed on the substrate 101; a semiconductor layer 113, a gate insulation film 115 and a gate electrode 116a sequentially stacked on the buffer film 102; and source and drain electrodes 118a and 118b connected to the semiconductor layer 113.

The semiconductor layer 113 has a width of a first length L1. Also, the semiconductor layer 113 is formed from a compound containing oxygen ions. A semiconductor thin film formed from the compound can be formed at a relative low temperature, and furthermore on a substrate such as a plastic plate, a plastic film or others. Also, the semiconductor thin film of the compound has an electron mobility ten times or more greater than that of amorphous silicon. As such, the semiconductor thin film of the compound is being spotlighted as a suitable element to realize a high definition of at least ultra-definition degree and a high speed operation of above 240 Hz.

As an example of the compound forming the semiconductor layer 113, a material selected from a material group which includes amorphous-indium-gallium-zinc-oxide (a-IGZO), amorphous-indium-tin-zinc-oxide (a-ITZO), indium-gallium-oxide (IGO) and so on can be used.

The semiconductor layer 113 includes a channel region 113a, and source and drain regions 114a and 114b. The source and drain regions 114a and 114b are formed through a process of metallizing the semiconductor layer 113.

The gate insulation film 115 formed on the semiconductor layer 113 has a width of a second length L2. The second length L2 is smaller than the first length L1 corresponding to the width of the semiconductor layer 113, but larger than a third length L3 which is the width of the gate electrode 116a. As such, the present disclosure allows the metallization of the semiconductor layer 113 to be performed using only the gate insulation film 115 having the width of the second length L2 without any additional mask procedure. Also, the channel region 113a of the semiconductor layer 113 can be formed with sufficient length.

The gate insulation film 115 can be formed from a material selected from a material group which includes silicon oxide (SiO$_2$), silicon nitride (SiNx) and silicon oxynitride (SiON). The gate electrode 116*a* can be formed from at least one material selected from a material group which consists of molybdenum (Mo), aluminum (Al), copper (Cu) and an alloy of molybdenum-titanium (MoTi).

An interlayer insulation film 117 is formed on the gate electrode 116*a* over the entire surface of the substrate 101.

The source and drain electrodes 118*a* and 118*b* are formed on the interlayer insulation film 117 in such a manner as to be connected to the source and drain regions 114*a* and 114*b* of the semiconductor layer 113, respectively. At the same time, a data line 118 connected to the source electrode 118*a* can be formed in the pixel region P, and a data pad 118*c* connected to the data line 118 within the pixel region P can be formed in a non-pixel region. The data pad 118*c* is used to transfer a signal from the exterior to the data line 118.

Subsequently, a passivation film 119 is formed over the entire surface of the substrate 101 including the pixel regions P. Also, a contact hole 120 exposing a part of the drain electrode 118*b* is formed in the passivation film 119. Moreover, the pixel electrode 121 is formed on the passivation film 119 in such a manner as to be connected to the drain electrode 118*b* through the contact hole 120.

FIGS. 4A through 4E are cross-sectional views illustrating step by step a fabricating method of a flat panel display device with an oxide thin film transistor according to an embodiment of the present disclosure.

Figure 4A:
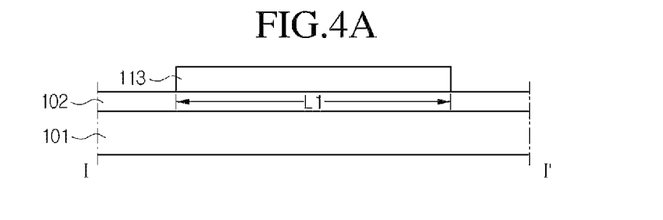
FIGS. 4A through 4E are cross-sectional views illustrating step by step a fabricating method of a flat panel display device with an oxide thin film transistor according to an embodiment of the present disclosure.

Referring to FIG. 4A, the method of fabricating the flat panel display device with the oxide thin film transistor according to an embodiment of the present disclosure firstly allows not only a buffer film 102 to be formed on a substrate 101 but also a semiconductor layer 113 with the width of a first length L1 to be formed on the buffer film 112.

The semiconductor layer 113 can be formed from a compound semiconductor containing oxygen ions. In detail, the semiconductor layer 113 can be formed from an oxide material which is possible to form into a thin film on a flexible substrate at a relative low temperature and has high mobility.

For example, one material selected from a material group which includes amorphous-indium-gallium-zinc-oxide (a-IGZO), amorphous-indium-tin-zinc-oxide (a-ITZO), indium-gallium-oxide (IGO) and so on can be used in the formation of the semiconductor layer.

The semiconductor layer 113 can be formed using one of a vapor deposition method and a photolithography method. For example, the semiconductor layer 113 can be obtained by forming a thin film of IGZO and so on using the vapor deposition method and patterning the thin film into a desired shape. The film formation process is employed for forming an oxide semiconductor sinter which is formed from one of IGZO and so on. As such, it is preferable to apply one of a sputtering method and a pulse laser deposition method, which are included in the vapor deposition methods, to the formation of the semiconductor layer 113. More preferably, the sputtering method is applied to the formation of the semiconductor layer 113 for the mass production of the flat panel display device.

The patterning process can be performed by forming a photoresist pattern on the thin film of IGZO or others opposite to a formation region of the semiconductor layer 113 and etching the thin film using an acid solution such as hydrochloric acid, nitric acid, dilute sulfuric acid, a mixed solution of phosphoric acid, nitric acid and acetic acid or others. Particularly, the solution containing phosphoric acid, nitric acid and acetic acid can remove an exposed portion of the IGZO film within a short time.

Figure 4B:
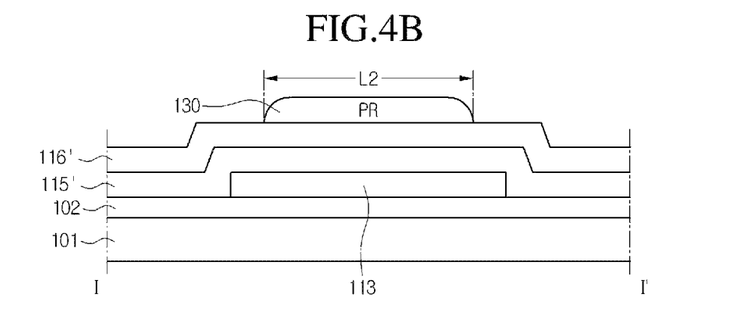

As shown in FIG. 4B, a gate insulation material layer 115' and a gate electrode material layer 116' are sequentially formed on the buffer film 102 and semiconductor layer 113 over the entire surface of the substrate 101.

Figure 4C:
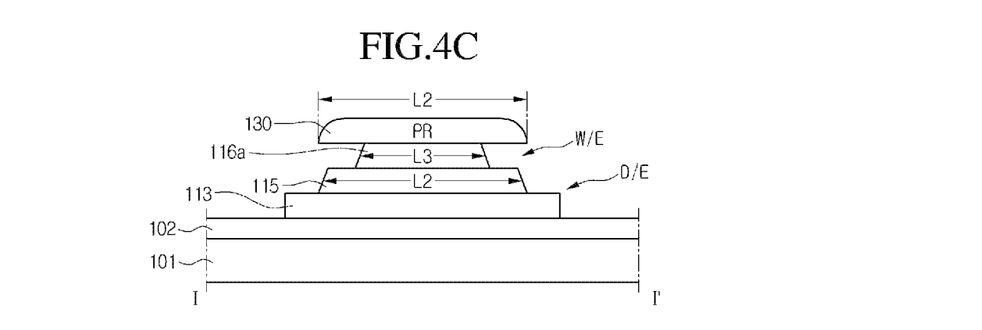

Thereafter, a photoresist pattern 130 with the width of a second length L2 is formed on the gate electrode material layer 116'. The photoresist pattern 130 is positioned on a region of the gate electrode material layer 116' opposite to a gate insulation film 115 which will be formed later as shown in FIG. 4C. The width of the photoresist pattern 130 having the second length L2 is almost equal to that of the gate insulation film 115 which will be formed later as shown in FIG. 4C.

Referring to FIG. 4C, a gate electrode 116*a* with the width of a third length L3 is formed by etching the gate electrode material layer 116' using the photoresist pattern 130 as a mask. This etching process is performed using a wet etching method.

Figure 4D:
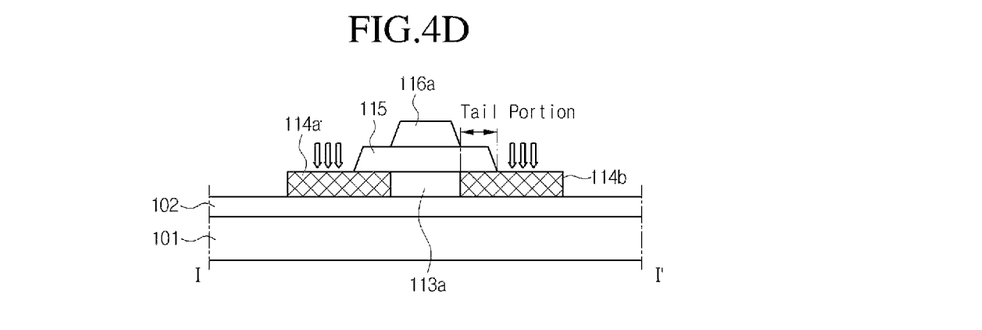
Figure 4E:
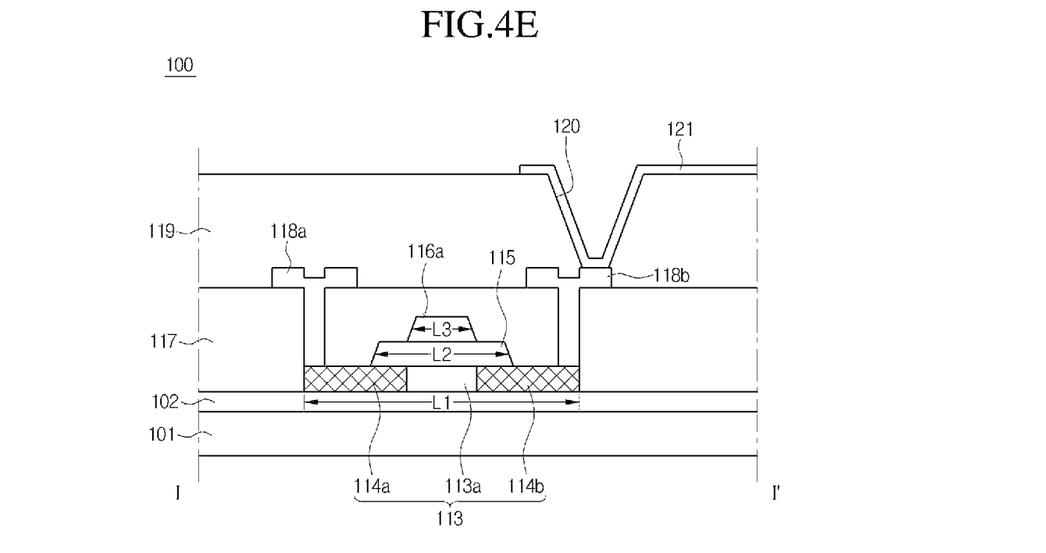

If the distance between the gate electrode 116*a* and the source and drain electrodes 118*a* and 118*b* becomes shorter as shown in FIG. 4E, a parasitic capacitance is generated and furthermore the performance of the element (i.e., the thin film transistor) deteriorates. As such, the third length L3 corresponding to the width of the gate electrode 116*a* is set to an extent of preventing the formation of a parasitic capacitance. However, the gate electrode 116 has a similar width to that of an ordinary thin film transistor with almost equal performance.

On the other hand, the second length L2 corresponding to the width of the photoresist pattern 130 is larger than the width of a related art photoresist pattern which is used to form the gate electrode of the ordinary thin film transistor with almost equal performance. As such, the etching process using the photoresist pattern 130 as a mask can be performed for a longer time, compared to another etch process using the related art photoresist pattern.

Subsequently, a gate insulation film 115 is formed by etching the gate insulation material layer 115' using the photoresist pattern 130 with the width of the second length L2 as a mask. At this time, the etching process of the gate insulation material layer 115' can be performed using a dry etching method. Thereafter, the photoresist pattern 130 is removed from the gate electrode 116*a*.

The formed gate insulation film 115 has a width of the second length L2 larger than that of the gate electrode 116*a*. The source and drain electrodes 118*a* and 118*b* do not cause any capacitance therebetween, unlike the gate electrode 116*a*. As such, the performance of the element (i.e., the thin film transistor) is unchanged even though the width of the gate insulation film 115 becomes wider.

As shown in FIG. 4D, a metallization process is performed for the semiconductor layer 113 using the gate insulation film 115 as a mask. In accordance therewith, source and drain regions 114*a* and 114*b* can be formed in the semiconductor layer 113.

As described above, the width of the gate insulation film 115 can be set without considering the parasitic capacitance. However, if the gate insulation film 115 has the same width as the gate electrode 116*a*, the metallized portion of the semiconductor layer 130 can expand under the gate electrode 116*a* when the metallization process is performed. Due to this, the width of a channel region 113*a* can become narrower than that of the gate electrode 116*a*. This short-channel structure can concentrate an electric field on the source and drain regions 114a and 114b of the semiconductor layer 130 and cause a hat carrier effect. In other words, the short-channel structure becomes a fault factor of the element (i.e., the thin film transistor).

In view of this point, the present disclosure allows the gate insulation film 115 to be formed in a wider width compared to the gate electrode 116a.

Meanwhile, the gate insulation film 115 can have a wider width than that of the semiconductor layer 113. In other words, the gate insulation film 115 can be formed in such a manner as to cover the entire surface of the semiconductor layer 113. Due to this, the gate insulation cannot be used in the metallization process of the semiconductor layer 113 as a mask.

As such, the metallization process must be performed just after the formation of the semiconductor layer 113. To this end, a mask pattern exposing portions of the semiconductor layer 113, in which source and drain regions will be formed, is formed on the semiconductor layer 113. The mask pattern is removed from the semiconductor layer 113 after the metallization process is performed for the portions of the semiconductor layer 113 which are exposed by the mask pattern.

The above-mentioned metallization process using an additional mask pattern requires an additional masking procedure, unlike the metallization process using the gate insulation film 115 as a mask. Due to this, the metallization process using the mask pattern increases fabrication time and costs.

In accordance therewith, the present disclosure sets the width of the gate insulation film 115 to be wider than that of the gate electrode 116a but narrower than that of the semiconductor layer 113.

The gate insulation film 115 includes tail portions not overlapping with the gate electrode 116a. As such, the metallized portions of the semiconductor layer 113 cannot expand under the gate electrode 116a. Therefore, the channel region 113a with an effective width that is not less than the width of the gate electrode 116a can be secured.

Figure 5:
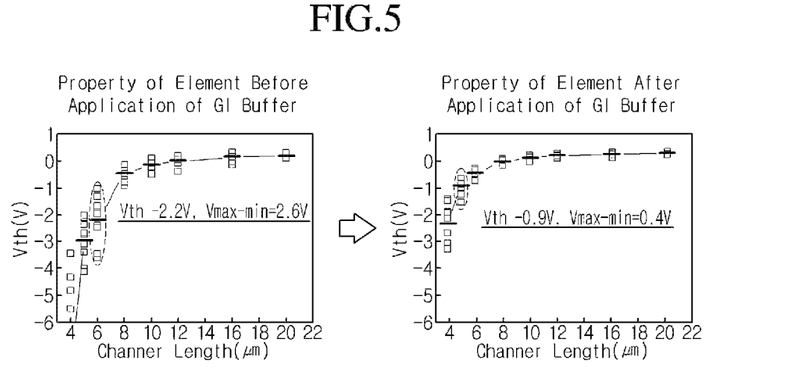
FIG. 5 is a data sheet illustrating enhanced properties of an element by applying the fabricating method of the flat panel display device with the oxide thin film transistor in accordance with an embodiment of the present disclosure.

FIG. 5 is a data sheet illustrating enhanced properties of an element by applying the fabricating method of the flat panel display device with the oxide thin film transistor in accordance with an embodiment of the present disclosure. In other words, FIG. 5 illustrates, by comparison, properties of elements formed through a metallization process using the gate insulation film with the tail portions and another metallization process using the gate insulation film without any tail portion.

Referring to FIG. 5, the fabricating method of the flat panel display device with the oxide thin film transistor according to the present disclosure allows the elements (i.e., the oxide thin film transistors) to obtain a smaller distribution area and a narrower shift width of threshold voltages Vth in a small channel length range, compared to those of the related art method. As such, the present disclosure can optimize the range of the threshold voltage Vth of the elements.

For example, if the channel has a length of about 6 μm, the elements of the related art method have a mean threshold voltage of −2.2V and a shift width of the threshold voltage (i.e., a different of maximum and minimum threshold voltages) corresponding to 2.6V, but those formed by the fabricating method of the present disclosure have a mean threshold voltage Vth of −0.9V and a shift width of the threshold voltage Vth (i.e., a difference of maximum and minimum threshold voltages Vth) corresponding to 0.4V.

Therefore, the fabricating method of the flat panel display device with the oxide thin film transistor according to the present disclosure can secure reliability and stability of elements (i.e., oxide thin film transistor) even though it is applied to a small-sized display device which must shorten the length of channel.

Referring to FIG. 4E, an interlayer insulation film 117 is formed on the entire surface of the buffer film 102 and the gate electrode 116a. Also, contact holes exposing the source and drain regions 114a and 114b of the semiconductor layer 113 are formed in the interlayer insulation film 117 by patterning the interlayer insulation film 117.

Subsequently, source and drain electrodes 118a and 118b connected to the semiconductor layer 113 are formed on the interlayer insulation film 117. The source and drain electrodes 118a and 118b can be obtained by depositing a metal film on the interlayer insulation film in such a manner as to fill the contact holes, and patterning the metal film. The metal film can be formed from at least one of ruthenium Ru, zinc Zn, Indium In, tin Sn and so on, Thereafter, a passivation film 119 is formed on the interlayer insulation film 117 in such a manner as to cover the source and drain electrodes 118a and 118b. Also, a contact hole 120 exposing a part of the drain electrode 118b is formed in the passivation film 119. Moreover, a pixel electrode 121 connected to the drain electrode 118b through the contact hole 120 is formed on the passivation film 119.

The flat panel display device with the oxide thin film transistor according to an embodiment of the present disclosure is a liquid crystal display device. In this case, the flat panel display device further includes a liquid crystal layer (not shown) and a color filter array substrate (not shown) which are stacked on the thin film transistor array substrate of FIG. 4E. Moreover, the flat panel display device includes polarizing plates disposed on rear surfaces of the thin film transistor array substrate 100 and the color filter array substrate, and a backlight unit disposed under the thin film transistor array substrate 100 as a light source.

Alternatively, the flat panel display device with the oxide thin film transistor according to an embodiment of the present disclosure can be an organic light emitting display device. In this case, the pixel electrode 121 on the thin film transistor array substrate 100 shown in FIG. 4E becomes one of an anode electrode and a cathode electrode.

Also, an organic light emission layer is formed on the anode electrode or the cathode electrode within each pixel region P and a sealing substrate configured to seal the pixel regions P is combined with the thin film transistor array substrate, thereby forming an organic light emitting display device.

In this manner, the flat panel display device with the oxide thin film transistor of a top gate type can secure an effective channel length of the semiconductor layer. Therefore, the flat panel display device can enhance reliability of the element (i.e., the oxide thin film transistor).

Also, the method of fabricating the flat panel display device with the oxide thin film transistor according to an embodiment of the present disclosure can simplify the fabricating procedure and reduce the number of mask procedures. As such, not only productivity can be enhanced but also fabricating costs can be reduced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. A flat panel display device with an oxide thin film transistor, the device comprising:
   a buffer film on a substrate;
   an oxide semiconductor layer of the oxide thin film transistor which has a width of a first length and is disposed on the buffer film, the oxide semiconductor layer having a source region and a drain region;
   a gate insulation film of the oxide thin film transistor which has a width of a second length and is disposed on the oxide semiconductor layer, the gate insulation film having a first end over the source region and a second end over the drain region, and the gate insulation film having a top surface parallel with and facing away from the substrate;
   a gate electrode of the oxide thin film transistor which has a width of a third length and is disposed on the gate insulation film, wherein a portion of the top surface of the gate insulation film extends away from the gate electrode;
   an interlayer insulation film on the gate electrode over an entire surface of the substrate;
   source and drain electrodes disposed on the interlayer insulation film and connected to the oxide semiconductor layer, the source electrode separated from the first end of the gate insulation film by the interlayer insulation film, and the drain electrode separated from the second end of the gate insulation film by the interlayer insulation film;
   a passivation film on the source and drain electrodes over the entire surface of the substrate; and
   a pixel electrode disposed on the passivation film and connected to the drain electrode,
   wherein the first length is larger than the second length and the second length is larger than the third length.

2. The flat panel display device of claim 1, wherein the oxide semiconductor layer includes a channel region, and wherein the gate electrode overlaps with the channel region.

3. The flat panel display device of claim 1, wherein the gate electrode comprises at least one of molybdenum (Mo), aluminum (Al), copper (Cu) and an alloy of molybdenum-titanium (MoTi).

4. The flat panel display device of claim 1, wherein the gate insulation film comprises a material selected from a material group consisting of silicon oxide ($SiO_2$), silicon nitride (SiNx) and silicon oxynitride (SiON).

5. The flat panel display device of claim 1, wherein the oxide semiconductor layer comprises a material selected from a material group consisting of amorphous-indium-gallium-zinc-oxide (a-IGZO), amorphous-indium-tin-zinc-oxide (a-ITZO) and indium-gallium-oxide (IGO).

* * * * *